US010258086B2

(12) United States Patent
Sur

(10) Patent No.: US 10,258,086 B2
(45) Date of Patent: Apr. 16, 2019

(54) HALL EFFECT CURRENT SENSOR FOR AN AEROSOL DELIVERY DEVICE

(71) Applicant: R.J. REYNOLDS TOBACCO COMPANY, Winston-Salem, NC (US)

(72) Inventor: Rajesh Sur, Winston-Salem, NC (US)

(73) Assignee: RAI STRATEGIC HOLDINGS, INC., Winston-Salem, NC (US)

( * ) Notice: Subject to any disclaimer, the term of this patent is extended or adjusted under 35 U.S.C. 154(b) by 365 days.

(21) Appl. No.: 14/993,762

(22) Filed: Jan. 12, 2016

(65) Prior Publication Data

US 2017/0196263 A1   Jul. 13, 2017

(51) Int. Cl.
*A24F 47/00* (2006.01)
*H05B 1/02* (2006.01)
*G01R 15/20* (2006.01)

(52) U.S. Cl.
CPC .......... *A24F 47/008* (2013.01); *G01R 15/202* (2013.01); *H05B 1/0244* (2013.01)

(58) Field of Classification Search
CPC ..... A24F 47/008; H05B 1/0244; H05B 6/108; G01R 15/202; A61L 2202/122; B24B 49/105; F22B 1/281
USPC ............... 131/328, 329, 330, 200, 273, 359; 219/601, 607, 609, 611, 624, 628, 629, 219/630, 634, 635, 643, 644, 675
See application file for complete search history.

(56) References Cited

U.S. PATENT DOCUMENTS

| 1,771,366 | A | 7/1930 | Wyss et al. |
| 2,057,353 | A | 10/1936 | Whittemore, Jr. |
| 2,104,266 | A | 1/1938 | McCormick |
| 3,200,819 | A | 8/1965 | Gilbert |
| 4,284,089 | A | 8/1981 | Ray |

(Continued)

FOREIGN PATENT DOCUMENTS

| AU | 276250 | 7/1965 |
| CA | 2 641 869 | 5/2010 |

(Continued)

OTHER PUBLICATIONS

Partial International Search Report dated Apr. 12, 2017 for International Application No. PCT/IB2017/050166.

(Continued)

*Primary Examiner* — Jimmy Chou
(74) *Attorney, Agent, or Firm* — Womble Bond Dickinson (US) LLP

(57) ABSTRACT

An aerosol delivery device is provided that includes a housing defining a reservoir configured to retain aerosol precursor composition. The aerosol delivery device also includes a plurality of electronic components interconnected by or connected to one or more conductors, and these electronic components include a heating element, a control component and a Hall effect current sensor. The control component is configured to operate in an active mode in which the control component is configured to control the heating element to activate and vaporize components of the aerosol precursor composition. The Hall effect current sensor is positioned proximate a conductor of the one or more conductors, and configured to measure to a current through the conductor. And the control component is configured to control operation of at least one functional element of the aerosol delivery device in response to the current so measured.

9 Claims, 7 Drawing Sheets

(56) References Cited

U.S. PATENT DOCUMENTS

| | | | |
|---|---|---|---|
| 4,303,083 A | 12/1981 | Burruss, Jr. | |
| 4,735,217 A | 4/1988 | Gerth et al. | |
| 4,848,374 A | 7/1989 | Chard et al. | |
| 4,907,606 A | 3/1990 | Lilja et al. | |
| 4,922,901 A | 5/1990 | Brooks et al. | |
| 4,945,931 A | 8/1990 | Gori | |
| 4,947,874 A | 8/1990 | Brooks et al. | |
| 4,947,875 A | 8/1990 | Brooks et al. | |
| 4,986,286 A | 1/1991 | Roberts et al. | |
| 4,998,006 A * | 3/1991 | Perlman | F24D 13/02 219/212 |
| 5,019,122 A | 5/1991 | Clearman et al. | |
| 5,042,510 A | 8/1991 | Curtiss et al. | |
| 5,060,671 A | 10/1991 | Counts et al. | |
| 5,093,894 A | 3/1992 | Deevi et al. | |
| 5,144,962 A | 9/1992 | Counts et al. | |
| 5,249,586 A | 10/1993 | Morgan et al. | |
| 5,261,424 A | 11/1993 | Sprinkel, Jr. | |
| 5,322,075 A | 6/1994 | Deevi et al. | |
| 5,353,813 A | 10/1994 | Deevi et al. | |
| 5,369,723 A | 11/1994 | Counts et al. | |
| 5,372,148 A | 12/1994 | McCafferty et al. | |
| 5,388,574 A | 2/1995 | Ingebrethsen et al. | |
| 5,408,574 A | 4/1995 | Deevi et al. | |
| 5,468,936 A | 11/1995 | Deevi et al. | |
| 5,498,850 A | 3/1996 | Das | |
| 5,515,842 A | 5/1996 | Ramseyer et al. | |
| 5,530,225 A | 6/1996 | Hajaligol | |
| 5,564,442 A | 10/1996 | MacDonald et al. | |
| 5,576,516 A * | 11/1996 | Kameyama | H01M 2/32 174/138 F |
| 5,649,554 A | 7/1997 | Sprinkel et al. | |
| 5,666,977 A | 9/1997 | Higgins et al. | |
| 5,687,746 A | 11/1997 | Rose et al. | |
| 5,726,421 A | 3/1998 | Fleischhauer et al. | |
| 5,727,571 A | 3/1998 | Meiring et al. | |
| 5,743,251 A | 4/1998 | Howell et al. | |
| 5,799,663 A | 9/1998 | Gross et al. | |
| 5,819,756 A | 10/1998 | Mielordt | |
| 5,865,185 A | 2/1999 | Collins et al. | |
| 5,865,186 A | 2/1999 | Volsey, II | |
| 5,878,752 A | 3/1999 | Adams et al. | |
| 5,894,841 A | 4/1999 | Voges | |
| 5,934,289 A | 8/1999 | Watkins et al. | |
| 5,954,979 A | 9/1999 | Counts et al. | |
| 5,967,148 A | 10/1999 | Harris et al. | |
| 6,040,560 A | 3/2000 | Fleischhauer et al. | |
| 6,053,176 A | 4/2000 | Adams et al. | |
| 6,089,857 A | 7/2000 | Matsuura et al. | |
| 6,095,153 A | 8/2000 | Kessler et al. | |
| 6,125,853 A | 10/2000 | Susa et al. | |
| 6,155,268 A | 12/2000 | Takeuchi | |
| 6,164,287 A | 12/2000 | White | |
| 6,196,218 B1 | 3/2001 | Voges | |
| 6,196,219 B1 | 3/2001 | Hess et al. | |
| 6,598,607 B2 | 7/2003 | Adiga et al. | |
| 6,601,776 B1 | 8/2003 | Oljaca et al. | |
| 6,615,840 B1 | 9/2003 | Fournier et al. | |
| 6,639,967 B2 * | 10/2003 | Marziale | H01J 1/135 378/108 |
| 6,688,313 B2 | 2/2004 | Wrenn et al. | |
| 6,772,756 B2 | 8/2004 | Shayan | |
| 6,803,545 B2 | 10/2004 | Blake et al. | |
| 6,854,461 B2 | 2/2005 | Nichols | |
| 6,854,470 B1 | 2/2005 | Pu | |
| 7,117,867 B2 | 10/2006 | Cox et al. | |
| 7,293,565 B2 | 11/2007 | Griffin et al. | |
| 7,513,253 B2 | 4/2009 | Kobayashi et al. | |
| 7,726,320 B2 * | 6/2010 | Robinson | A24F 47/008 131/200 |
| 7,775,459 B2 | 8/2010 | Martens, III et al. | |
| 7,832,410 B2 | 11/2010 | Hon | |
| 7,845,359 B2 | 12/2010 | Montaser | |
| 7,896,006 B2 | 3/2011 | Hamano et al. | |
| 8,127,772 B2 | 3/2012 | Montaser | |
| 8,314,591 B2 | 11/2012 | Terry et al. | |
| 8,365,742 B2 | 2/2013 | Hon | |
| 8,402,976 B2 | 3/2013 | Fernando et al. | |
| 8,499,766 B1 | 8/2013 | Newton | |
| 8,528,569 B1 | 9/2013 | Newton | |
| 8,550,069 B2 | 10/2013 | Alelov | |
| 9,372,012 B2 * | 6/2016 | Farris | F24H 9/2021 |
| 9,612,262 B1 * | 4/2017 | Nehmeh | G01R 15/202 |
| 2002/0146242 A1 | 10/2002 | Vieira | |
| 2003/0216877 A1 * | 11/2003 | Culler | G01R 15/202 702/64 |
| 2003/0226837 A1 | 12/2003 | Blake et al. | |
| 2004/0118401 A1 | 6/2004 | Smith et al. | |
| 2004/0129280 A1 | 7/2004 | Woodson et al. | |
| 2004/0200488 A1 | 10/2004 | Felter et al. | |
| 2004/0226568 A1 | 11/2004 | Takeuchi et al. | |
| 2005/0016550 A1 | 1/2005 | Katase | |
| 2006/0016453 A1 | 1/2006 | Kim | |
| 2006/0196518 A1 | 9/2006 | Hon | |
| 2007/0074734 A1 | 4/2007 | Braunshteyn et al. | |
| 2007/0102013 A1 | 5/2007 | Adams et al. | |
| 2007/0215167 A1 | 9/2007 | Crooks et al. | |
| 2008/0085103 A1 | 4/2008 | Beland et al. | |
| 2008/0092912 A1 | 4/2008 | Robinson et al. | |
| 2008/0257367 A1 | 10/2008 | Paterno et al. | |
| 2008/0276947 A1 | 11/2008 | Martzel | |
| 2008/0302374 A1 | 12/2008 | Wengert et al. | |
| 2009/0095311 A1 | 4/2009 | Hon | |
| 2009/0095312 A1 | 4/2009 | Herbrich et al. | |
| 2009/0126745 A1 | 5/2009 | Hon | |
| 2009/0188490 A1 | 7/2009 | Hon | |
| 2009/0230117 A1 | 9/2009 | Fernando et al. | |
| 2009/0272379 A1 | 11/2009 | Thorens et al. | |
| 2009/0283103 A1 | 11/2009 | Nielsen et al. | |
| 2009/0320863 A1 | 12/2009 | Fernando et al. | |
| 2010/0043809 A1 | 2/2010 | Magnon | |
| 2010/0083959 A1 | 4/2010 | Siller | |
| 2010/0200006 A1 | 8/2010 | Robinson et al. | |
| 2010/0229881 A1 | 9/2010 | Hearn | |
| 2010/0242974 A1 | 9/2010 | Pan | |
| 2010/0307518 A1 | 12/2010 | Wang | |
| 2010/0313901 A1 | 12/2010 | Fernando et al. | |
| 2011/0005535 A1 | 1/2011 | Xiu | |
| 2011/0011396 A1 | 1/2011 | Fang | |
| 2011/0036363 A1 | 2/2011 | Urtsev et al. | |
| 2011/0036365 A1 | 2/2011 | Chong et al. | |
| 2011/0094523 A1 | 4/2011 | Thorens et al. | |
| 2011/0126848 A1 | 6/2011 | Zuber et al. | |
| 2011/0155153 A1 | 6/2011 | Thorens et al. | |
| 2011/0155718 A1 | 6/2011 | Greim et al. | |
| 2011/0168194 A1 | 7/2011 | Hon | |
| 2011/0265806 A1 * | 11/2011 | Alarcon | A24F 47/00 131/273 |
| 2011/0309157 A1 | 12/2011 | Yang et al. | |
| 2012/0042885 A1 | 2/2012 | Stone et al. | |
| 2012/0060853 A1 | 3/2012 | Robinson et al. | |
| 2012/0111347 A1 | 5/2012 | Hon | |
| 2012/0132643 A1 | 5/2012 | Choi et al. | |
| 2012/0181640 A1 * | 7/2012 | von Koblinski | H01L 21/84 257/421 |
| 2012/0227752 A1 | 9/2012 | Alelov | |
| 2012/0231464 A1 | 9/2012 | Yu et al. | |
| 2012/0260927 A1 | 10/2012 | Liu | |
| 2012/0279512 A1 | 11/2012 | Hon | |
| 2012/0318882 A1 | 12/2012 | Abehasera | |
| 2013/0037041 A1 | 2/2013 | Worm et al. | |
| 2013/0056013 A1 | 3/2013 | Terry et al. | |
| 2013/0066500 A1 * | 3/2013 | Wyatt | B60K 7/0007 701/22 |
| 2013/0081625 A1 | 4/2013 | Rustad et al. | |
| 2013/0081642 A1 | 4/2013 | Safari | |
| 2013/0104916 A1 * | 5/2013 | Bellinger | A61M 11/041 131/328 |
| 2013/0192619 A1 | 8/2013 | Tucker et al. | |
| 2013/0255702 A1 | 10/2013 | Griffith, Jr. et al. | |
| 2013/0306084 A1 | 11/2013 | Flick | |
| 2013/0319439 A1 | 12/2013 | Gorelick et al. | |
| 2013/0340750 A1 | 12/2013 | Thorens et al. | |
| 2013/0340775 A1 | 12/2013 | Juster et al. | |

(56) References Cited

U.S. PATENT DOCUMENTS

| | | | |
|---|---|---|---|
| 2014/0000638 A1 | 1/2014 | Sebastian et al. | |
| 2014/0060554 A1 | 3/2014 | Collett et al. | |
| 2014/0060555 A1 | 3/2014 | Chang et al. | |
| 2014/0096781 A1 | 4/2014 | Sears et al. | |
| 2014/0096782 A1 | 4/2014 | Ampolini et al. | |
| 2014/0109921 A1 | 4/2014 | Chen | |
| 2014/0157583 A1 | 6/2014 | Ward et al. | |
| 2014/0209105 A1 | 7/2014 | Sears et al. | |
| 2014/0253144 A1* | 9/2014 | Novak, III | G01R 31/327 324/550 |
| 2014/0261408 A1 | 9/2014 | DePiano et al. | |
| 2014/0261486 A1 | 9/2014 | Potter et al. | |
| 2014/0261487 A1 | 9/2014 | Chapman et al. | |
| 2014/0261495 A1 | 9/2014 | Novak et al. | |
| 2014/0270727 A1 | 9/2014 | Ampolini et al. | |
| 2014/0270729 A1 | 9/2014 | DePiano et al. | |
| 2014/0270730 A1 | 9/2014 | DePiano et al. | |
| 2014/0345631 A1 | 11/2014 | Bowen et al. | |
| 2015/0053217 A1 | 2/2015 | Steingraber et al. | |
| 2015/0297776 A1* | 10/2015 | Conroy | G06Q 10/08 239/11 |
| 2015/0327596 A1* | 11/2015 | Alarcon | A24F 47/008 131/328 |
| 2015/0333552 A1* | 11/2015 | Alarcon | H02J 7/0052 131/329 |
| 2015/0333561 A1* | 11/2015 | Alarcon | H02J 7/0042 131/329 |
| 2016/0057811 A1* | 2/2016 | Alarcon | A24F 47/008 219/494 |
| 2017/0181223 A1* | 6/2017 | Sur | H04B 5/0081 |

FOREIGN PATENT DOCUMENTS

| | | |
|---|---|---|
| CN | 1541577 | 11/2004 |
| CN | 2719043 | 8/2005 |
| CN | 200997909 | 1/2008 |
| CN | 101116542 | 2/2008 |
| CN | 101176805 | 5/2008 |
| CN | 201379072 | 1/2010 |
| CN | 105146756 A | 12/2015 |
| DE | 10 2006 004 484 | 8/2007 |
| DE | 102006041042 | 3/2008 |
| DE | 20 2009 010 400 | 11/2009 |
| EP | 0 295 122 | 12/1988 |
| EP | 0 430 566 | 6/1991 |
| EP | 0 845 220 | 6/1998 |
| EP | 1 618 803 | 1/2006 |
| EP | 2 316 286 | 5/2011 |
| GB | 2469850 | 11/2010 |
| WO | WO 1997/48293 | 12/1997 |
| WO | WO 2003/034847 | 5/2003 |
| WO | WO 2004/043175 | 5/2004 |
| WO | WO 2004/080216 | 9/2004 |
| WO | WO 2005/099494 | 10/2005 |
| WO | WO 2007/078273 | 7/2007 |
| WO | WO 2007/131449 | 11/2007 |
| WO | WO 2009/105919 | 9/2009 |
| WO | WO 2009/155734 | 12/2009 |
| WO | WO 2010/003480 | 1/2010 |
| WO | WO 2010/045670 | 4/2010 |
| WO | WO 2010/073122 | 7/2010 |
| WO | WO 2010/118644 | 10/2010 |
| WO | WO 2010/140937 | 12/2010 |
| WO | WO 2011/010334 | 1/2011 |
| WO | 2012027350 A2 | 3/2012 |
| WO | WO 2012/072762 | 6/2012 |
| WO | WO 2012/100523 | 8/2012 |
| WO | WO 2013/089551 | 6/2013 |
| WO | 2015028814 A1 | 3/2015 |

OTHER PUBLICATIONS

International Search Report for International Application No. PCT/IB2017/050166 dated Jul. 5, 2017.
MLX91205, Melexis Microelectronic Integrated Systems, IMC-Hall® Current Sensor (Triaxis® Technology), pp. 1-14, Jun. 2013.
MLX91206, Melexis Microelectronic Integrated Systems, IMC-Hall® Current Sensor (Triaxis® Technology), pp. 1-25, Dec. 2013.
"Current Sensors Reference Design Guide", Melexis Microelectronic Integrated Systems, IMC- Hall® Current Sensor (Triaxis® Technology), pp. 1-25, Dec. 2015.
"Hall Effect Sensing and Application", Honeywell, MICRO SWITCH Sensing and Control, www.honeywell.com/sensing, pp. 1-126, 2004.

* cited by examiner

US 10,258,086 B2

HALL EFFECT CURRENT SENSOR FOR AN AEROSOL DELIVERY DEVICE

TECHNOLOGICAL FIELD

The present disclosure relates to aerosol delivery devices such as smoking articles, and more particularly to aerosol delivery devices that may utilize electrically generated heat for the production of aerosol (e.g., smoking articles commonly referred to as electronic cigarettes). The smoking articles may be configured to heat an aerosol precursor, which may incorporate materials that may be made or derived from, or otherwise incorporate tobacco, the precursor being capable of forming an inhalable substance for human consumption.

BACKGROUND

Many smoking devices have been proposed through the years as improvements upon, or alternatives to, smoking products that require combusting tobacco for use. Many of those devices purportedly have been designed to provide the sensations associated with cigarette, cigar or pipe smoking, but without delivering considerable quantities of incomplete combustion and pyrolysis products that result from the burning of tobacco. To this end, there have been proposed numerous smoking products, flavor generators and medicinal inhalers that utilize electrical energy to vaporize or heat a volatile material, or attempt to provide the sensations of cigarette, cigar or pipe smoking without burning tobacco to a significant degree. See, for example, the various alternative smoking articles, aerosol delivery devices and heat generating sources set forth in the background art described in U.S. Pat. No. 7,726,320 to Robinson et al. and U.S. Pat. No. 8,881,737 to Collett et al., which are incorporated herein by reference. See also, for example, the various types of smoking articles, aerosol delivery devices and electrically-powered heat generating sources referenced by brand name and commercial source in U.S. Pat. Pub. No. 2015/0216232 to Bless et al., which is incorporated herein by reference. Additionally, various types of electrically powered aerosol and vapor delivery devices also have been proposed in U.S. Pat. Pub. Nos. 2014/0096781 to Sears et al. and 2014/0283859 to Minskoff et al., as well as U.S. patent application Ser. No. 14/282,768 to Sears et al., filed May 20, 2014; Ser. No. 14/286,552 to Brinkley et al., filed May 23, 2014; Ser. No. 14/327,776 to Ampolini et al., filed Jul. 10, 2014; and Ser. No. 14/465,167 to Worm et al., filed Aug. 21, 2014; all of which are incorporated herein by reference.

BRIEF SUMMARY

The present disclosure relates to aerosol delivery devices, methods of forming such devices, and elements of such devices. The present disclosure includes, without limitation, the following example implementations. In some examples, an aerosol delivery device is provided. The aerosol delivery device comprises a housing defining a reservoir configured to retain aerosol precursor composition; and a plurality of electronic components interconnected by or connected to one or more conductors, the plurality of electronic components including: a heating element; a control component configured to operate in an active mode in which the control component is configured to control the heating element to activate and vaporize components of the aerosol precursor composition; and a Hall effect current sensor positioned proximate a conductor of the one or more conductors, and configured to measure to a current through the conductor, the control component being configured to control operation of at least one functional element of the aerosol delivery device in response to the current so measured.

In some example implementations of the aerosol delivery device of the preceding or any subsequent example implementation, or any combination thereof, the conductor of the one or more conductors is connected to a terminal that is connected or connectable with a power source, the control component in the active mode being configured to direct power from the power source to the heating element to activate and vaporize components of the aerosol precursor composition.

In some example implementations of the aerosol delivery device of any preceding or any subsequent example implementation, or any combination thereof, the control component being configured to control operation of the at least one functional element includes being configured to cut off the power supply in an instance in which the current through the conductor is above a threshold level indicative of an over-current or over-voltage condition.

In some example implementations of the aerosol delivery device of any preceding or any subsequent example implementation, or any combination thereof, the conductor of the one or more conductors is connected to the heating element or a terminal that is connected or connectable with the heating element, and the current through the conductor corresponds to a current through the heating element in the active mode.

In some example implementations of the aerosol delivery device of any preceding or any subsequent example implementation, or any combination thereof, the control component being configured to control operation of the at least one functional element includes in the active mode being configured to at least: direct power to the heating element to turn the heating element on activate and vaporize components of the aerosol precursor composition, and commensurately initiate a heating time period; and at a periodic rate until expiration of the heating time period, determine a moving window of measurements of instantaneous actual power directed to the heating element, each measurement of the window of measurements being determined as a product of a voltage at the heating element and the current through the heating element; calculate a simple moving average power directed to the heating element based on the moving window of measurements of instantaneous actual power; and adjust the power directed to the heating element to turn the heating element off or on at the periodic rate at each instance in which the simple moving average power is respectively above or below a selected power set point.

In some example implementations of the aerosol delivery device of any preceding or any subsequent example implementation, or any combination thereof, the aerosol delivery device further comprises another Hall effect current sensor positioned proximate another the conductor of the one or more conductors, the other conductor being connected to a terminal that is connected or connectable with a power source from which the control component is configured to direct the power to the heating element, wherein the other Hall effect current sensor is configured to measure to a current through the other conductor, the control component is configured to further control operation of the at least one functional element in response to the current so measured by the other Hall effect current sensor.

In some example implementations of the aerosol delivery device of any preceding or any subsequent example implementation, or any combination thereof, the control component being configured to further control operation of the at least one functional element includes being configured to cut off the power supply in an instance in which the current through the other conductor is above a threshold level indicative of an over-current or over-voltage condition.

In some example implementations, a control body is provided. The control body is coupled or coupleable with a cartridge that is equipped with a heating element and contains an aerosol precursor composition, the control body being coupled or coupleable with the cartridge to form an aerosol delivery device in which the heating element is configured to activate and vaporize components of the aerosol precursor composition. The control body comprises a plurality of electronic components interconnected by or connected to one or more conductors, the plurality of electronic components including: a microprocessor configured to operate in an active mode in which the control body is coupled with the cartridge, the microprocessor in the active mode being configured to control the heating element to activate and vaporize components of the aerosol precursor composition; and a Hall effect current sensor positioned proximate a conductor of the one or more conductors, and configured to measure to a current through the conductor, the microprocessor being configured to control operation of at least one functional element of the control body, cartridge or aerosol delivery device in response to the current so measured.

In some example implementations of the control body of any preceding or any subsequent example implementation, or any combination thereof, the conductor of the one or more conductors is connected to a terminal that is connected or connectable with a power source, the microprocessor in the active mode being configured to direct power from the power source to the heating element to activate and vaporize components of the aerosol precursor composition.

In some example implementations of the control body of any preceding or any subsequent example implementation, or any combination thereof, the microprocessor being configured to control operation of the at least one functional element includes being configured to cut off the power supply in an instance in which the current through the conductor is above a threshold level indicative of an over-current or over-voltage condition.

In some example implementations of the control body of any preceding or any subsequent example implementation, or any combination thereof, the conductor of the one or more conductors is connected to a terminal that is connected or connectable with the heating element, and the current through the conductor corresponds to a current through the heating element in the active mode in which the control body is coupled with the cartridge.

In some example implementations of the control body of any preceding or any subsequent example implementation, or any combination thereof, the microprocessor being configured to control operation of the at least one functional element includes in the active mode being configured to at least: direct power to the heating element to turn the heating element on activate and vaporize components of the aerosol precursor composition, and commensurately initiate a heating time period; and at a periodic rate until expiration of the heating time period, determine a moving window of measurements of instantaneous actual power directed to the heating element, each measurement of the window of measurements being determined as a product of a voltage at the heating element and the current through the heating element; calculate a simple moving average power directed to the heating element based on the moving window of measurements of instantaneous actual power; and adjust the power directed to the heating element to turn the heating element off or on at the periodic rate at each instance in which the simple moving average power is respectively above or below a selected power set point.

In some example implementations of the control body of any preceding or any subsequent example implementation, or any combination thereof, the control body further comprises another Hall effect current sensor positioned proximate another the conductor of the one or more conductors, the other conductor being connected to a terminal that is connected or connectable with a power source from which the microprocessor is configured to direct the power to the heating element, wherein the other Hall effect current sensor is configured to measure to a current through the other conductor, the microprocessor is configured to further control operation of the at least one functional element in response to the current so measured by the other Hall effect current sensor.

In some example implementations of the control body of any preceding or any subsequent example implementation, or any combination thereof, the microprocessor being configured to further control operation of the at least one functional element includes being configured to cut off the power supply in an instance in which the current through the other conductor is above a threshold level indicative of an over-current or over-voltage condition.

In some example implementations, a cartridge is provided. The cartridge is coupled or coupleable with a control body that is equipped with a microprocessor, the control body being coupled or coupleable with the cartridge to form an aerosol delivery device. The cartridge comprises a housing defining a reservoir configured to retain aerosol precursor composition; and a plurality of electronic components interconnected by or connected to one or more conductors, the plurality of electronic components including: a heating element configured to operate in an active mode in which the cartridge is coupled with the control body, the heating element in the active mode being controllable by the microprocessor to activate and vaporize components of the aerosol precursor composition; and a Hall effect current sensor positioned proximate a conductor of the one or more conductors, and configured to measure to a current through the conductor, the microprocessor being configured to control operation of at least one functional element of the control body, cartridge or aerosol delivery device in response to the current so measured.

In some example implementations of the cartridge of any preceding or any subsequent example implementation, or any combination thereof, the conductor of the one or more conductors is connected to a terminal that is connected or connectable with a power source, the microprocessor in the active mode being configured to direct power from the power source to the heating element to activate and vaporize components of the aerosol precursor composition.

In some example implementations of the cartridge of any preceding or any subsequent example implementation, or any combination thereof, the microprocessor being configured to control operation of the at least one functional element includes being configured to cut off the power supply in an instance in which the current through the conductor is above a threshold level indicative of an over-current or over-voltage condition.

In some example implementations of the cartridge of any preceding or any subsequent example implementation, or any combination thereof, the conductor of the one or more conductors is connected to the heating element, and the current through the conductor corresponds to a current through the heating element in the active mode in which the control body is coupled with the cartridge.

In some example implementations of the cartridge of any preceding or any subsequent example implementation, or any combination thereof, the microprocessor being configured to control operation of the at least one functional element includes in the active mode being configured to at least: direct power to the heating element to turn the heating element on activate and vaporize components of the aerosol precursor composition, and commensurately initiate a heating time period; and at a periodic rate until expiration of the heating time period, determine a moving window of measurements of instantaneous actual power directed to the heating element, each measurement of the window of measurements being determined as a product of a voltage at the heating element and the current through the heating element; calculate a simple moving average power directed to the heating element based on the moving window of measurements of instantaneous actual power; and adjust the power directed to the heating element to turn the heating element off or on at the periodic rate at each instance in which the simple moving average power is respectively above or below a selected power set point.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as intended, namely to be combinable, unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described the disclosure in the foregoing general terms, reference will now be made to the accompanying drawings, which are not necessarily drawn to scale, and wherein:

DETAILED DESCRIPTION

Figure 1:
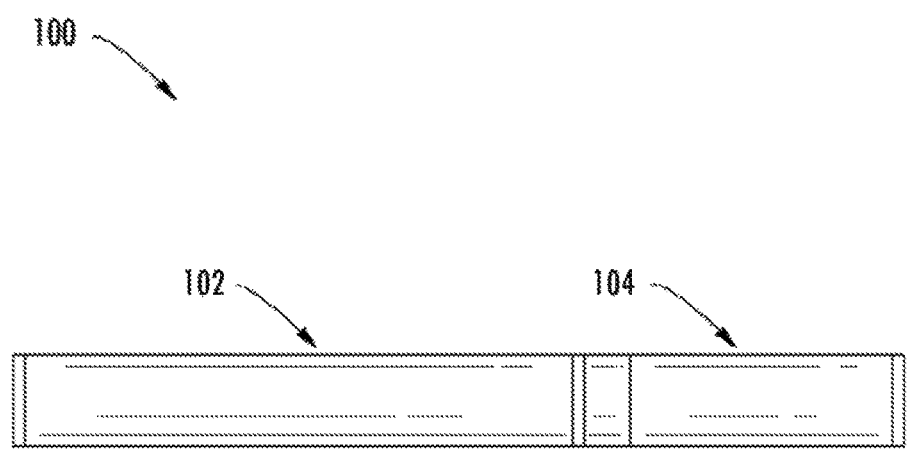
FIG. 1 illustrates a side view of an aerosol delivery device including a cartridge coupled to a control body according to an example implementation of the present disclosure.

The present disclosure will now be described more fully hereinafter with reference to example implementations thereof. These example implementations are described so that this disclosure will be thorough and complete, and will fully convey the scope of the disclosure to those skilled in the art. Indeed, the disclosure may be embodied in many different forms and should not be construed as limited to the implementations set forth herein; rather, these implementations are provided so that this disclosure will satisfy applicable legal requirements. As used in the specification and the appended claims, the singular forms "a," "an," "the" and the like include plural referents unless the context clearly dictates otherwise.

As described hereinafter, example implementations of the present disclosure relate to aerosol delivery systems. Aerosol delivery systems according to the present disclosure use electrical energy to heat a material (preferably without combusting the material to any significant degree) to form an inhalable substance; and components of such systems have the form of articles most preferably are sufficiently compact to be considered hand-held devices. That is, use of components of preferred aerosol delivery systems does not result in the production of smoke in the sense that aerosol results principally from by-products of combustion or pyrolysis of tobacco, but rather, use of those preferred systems results in the production of vapors resulting from volatilization or vaporization of certain components incorporated therein. In some example implementations, components of aerosol delivery systems may be characterized as electronic cigarettes, and those electronic cigarettes most preferably incorporate tobacco and/or components derived from tobacco, and hence deliver tobacco derived components in aerosol form.

Aerosol generating pieces of certain preferred aerosol delivery systems may provide many of the sensations (e.g., inhalation and exhalation rituals, types of tastes or flavors, organoleptic effects, physical feel, use rituals, visual cues such as those provided by visible aerosol, and the like) of smoking a cigarette, cigar or pipe that is employed by lighting and burning tobacco (and hence inhaling tobacco smoke), without any substantial degree of combustion of any component thereof. For example, the user of an aerosol generating piece of the present disclosure can hold and use that piece much like a smoker employs a traditional type of smoking article, draw on one end of that piece for inhalation of aerosol produced by that piece, take or draw puffs at selected intervals of time, and the like.

Aerosol delivery systems of the present disclosure also can be characterized as being vapor-producing articles or medicament delivery articles. Thus, such articles or devices can be adapted so as to provide one or more substances (e.g., flavors and/or pharmaceutical active ingredients) in an inhalable form or state. For example, inhalable substances can be substantially in the form of a vapor (i.e., a substance that is in the gas phase at a temperature lower than its critical point). Alternatively, inhalable substances can be in the form of an aerosol (i.e., a suspension of fine solid particles or liquid droplets in a gas). For purposes of simplicity, the term "aerosol" as used herein is meant to include vapors, gases and aerosols of a form or type suitable for human inhalation, whether or not visible, and whether or not of a form that might be considered to be smoke-like.

Aerosol delivery systems of the present disclosure generally include a number of components provided within an outer body or shell, which may be referred to as a housing. The overall design of the outer body or shell can vary, and the format or configuration of the outer body that can define the overall size and shape of the aerosol delivery device can vary. Typically, an elongated body resembling the shape of a cigarette or cigar can be a formed from a single, unitary housing or the elongated housing can be formed of two or more separable bodies. For example, an aerosol delivery device can comprise an elongated shell or body that can be substantially tubular in shape and, as such, resemble the shape of a conventional cigarette or cigar. In one example, all of the components of the aerosol delivery device are contained within one housing. Alternatively, an aerosol delivery device can comprise two or more housings that are joined and are separable. For example, an aerosol delivery device can possess at one end a control body comprising a housing containing one or more reusable components (e.g., an accumulator such as a rechargeable battery, thin film solid state battery and/or capacitor, and various electronics for controlling the operation of that article), and at the other end and removably coupleable thereto, an outer body or shell containing a disposable portion (e.g., a disposable flavor-containing cartridge).

Aerosol delivery systems of the present disclosure most preferably comprise some combination of a power source (i.e., an electrical power source), at least one control component (e.g., means for actuating, controlling, regulating and ceasing power for heat generation, such as by controlling electrical current flow the power source to other components of the article—e.g., a microprocessor, individually or as part of a microcontroller), a heater or heat generation member (e.g., an electrical resistance heating element or other component, which alone or in combination with one or more further elements may be commonly referred to as an "atomizer"), an aerosol precursor composition (e.g., commonly a liquid capable of yielding an aerosol upon application of sufficient heat, such as ingredients commonly referred to as "smoke juice," "e-liquid" and "e-juice"), and a mouthend region or tip for allowing draw upon the aerosol delivery device for aerosol inhalation (e.g., a defined airflow path through the article such that aerosol generated can be withdrawn therefrom upon draw).

More specific formats, configurations and arrangements of components within the aerosol delivery systems of the present disclosure will be evident in light of the further disclosure provided hereinafter. Additionally, the selection and arrangement of various aerosol delivery system components can be appreciated upon consideration of the commercially available electronic aerosol delivery devices, such as those representative products referenced in background art section of the present disclosure.

In various examples, an aerosol delivery device can comprise a reservoir configured to retain the aerosol precursor composition. The reservoir particularly can be formed of a porous material (e.g., a fibrous material) and thus may be referred to as a porous substrate (e.g., a fibrous substrate).

A fibrous substrate useful as a reservoir in an aerosol delivery device can be a woven or nonwoven material formed of a plurality of fibers or filaments and can be formed of one or both of natural fibers and synthetic fibers. For example, a fibrous substrate may comprise a fiberglass material. In particular examples, a cellulose acetate material can be used. In other example implementations, a carbon material can be used. A reservoir may be substantially in the form of a container and may include a fibrous material included therein.

FIG. 1 illustrates a side view of an aerosol delivery device 100 including a control body 102 and a cartridge 104, according to various example implementations of the present disclosure. In particular, FIG. 1 illustrates the control body and the cartridge coupled to one another. The control body and the cartridge may be detachably aligned in a functioning relationship. Various mechanisms may connect the cartridge to the control body to result in a threaded engagement, a press-fit engagement, an interference fit, a magnetic engagement or the like. The aerosol delivery device may be substantially rod-like, substantially tubular shaped, or substantially cylindrically shaped in some example implementations when the cartridge and the control body are in an assembled configuration. The aerosol delivery device may also be substantially rectangular or rhomboidal in cross-section, which may lend itself to greater compatibility with a substantially flat or thin-film power source, such as a power source including a flat battery. The cartridge and control body may include separate, respective housings or outer bodies, which may be formed of any of a number of different materials. The housing may be formed of any suitable, structurally-sound material. In some examples, the housing may be formed of a metal or alloy, such as stainless steel, aluminum or the like. Other suitable materials include various plastics (e.g., polycarbonate), metal-plating over plastic, ceramics and the like.

In some example implementations, one or both of the control body 102 or the cartridge 104 of the aerosol delivery device 100 may be referred to as being disposable or as being reusable. For example, the control body may have a replaceable battery or a rechargeable battery and thus may be combined with any type of recharging technology, including connection to a typical alternating current electrical outlet, connection to a car charger (i.e., a cigarette lighter receptacle), connection to a computer, such as through a universal serial bus (USB) cable or connector, or connection to a photovoltaic cell (sometimes referred to as a solar cell) or solar panel of solar cells. Further, in some example implementations, the cartridge may comprise a single-use cartridge, as disclosed in U.S. Pat. No. 8,910,639 to Chang et al., which is incorporated herein by reference in its entirety.

Figure 2:
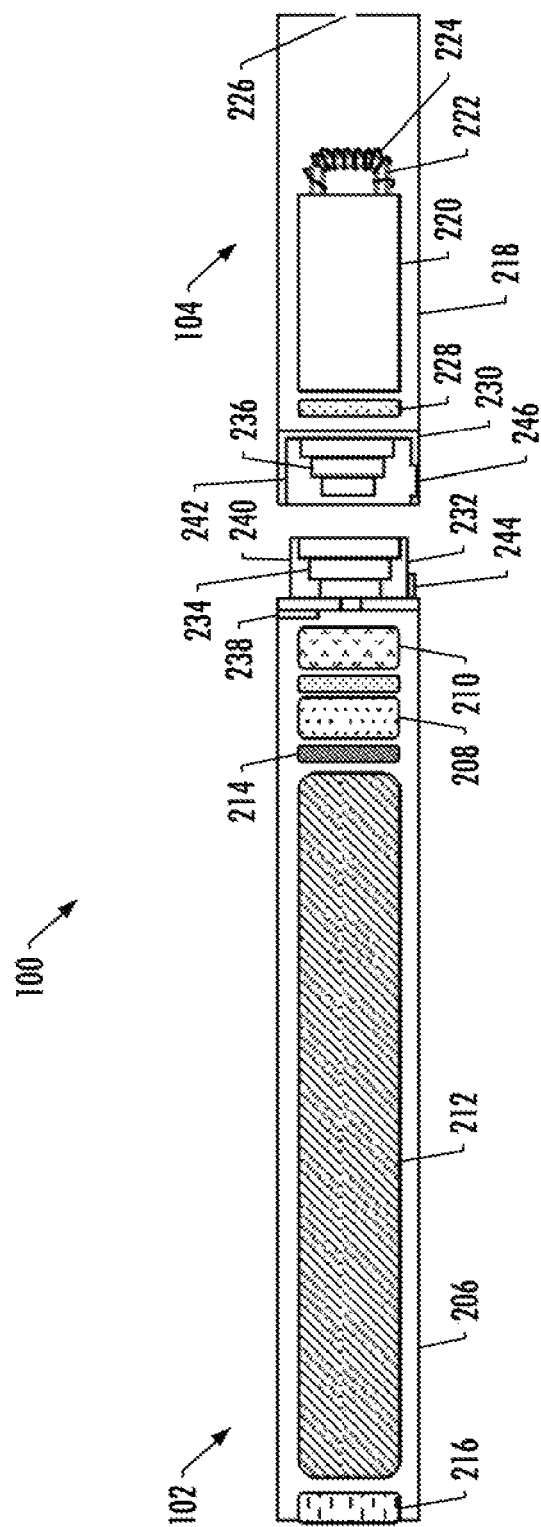
FIG. 2 is a partially cut-away view of the aerosol delivery device according to various example implementations.

FIG. 2 more particularly illustrates the aerosol delivery device 100, in accordance with some example implementations. As seen in the cut-away view illustrated therein, again, the aerosol delivery device can comprise a control body 102 and a cartridge 104 each of which include a number of respective components. The components illustrated in FIG. 2 are representative of the components that may be present in a control body and cartridge and are not intended to limit the scope of components that are encompassed by the present disclosure. As shown, for example, the control body can be formed of a control body shell 206 that can include one or more of each of a number of electronic components, such as a control component 208 (e.g., a microprocessor, individually or as part of a microcontroller), a flow sensor 210, a power source 212, a Hall effect current sensor 214 and/or light-emitting diode (LED) 216, and such components can be variably aligned. The power source may include, for example, a battery (single-use or rechargeable), solid-state battery, thin-film solid-state battery, supercapacitor or the like, or some combination thereof. Some examples of a suitable power source are provided in U.S. patent application Ser. No. 14/918,926 to Sur et al., filed Oct. 21, 2015, which is incorporated by reference. The LED may be one example of a suitable visual indicator with which the aerosol delivery device 100 may be equipped. Other indicators such as audio indicators (e.g., speakers), haptic indicators (e.g., vibration motors) or the like can be included in addition to or as an alternative to visual indicators such as the LED.

The cartridge 104 can be formed of a cartridge shell 218 enclosing a reservoir 220 configured to retain the aerosol precursor composition, and including a heater 224 (sometimes referred to as a heating element). In various configurations, this structure may be referred to as a tank; and accordingly, the terms "cartridge," "tank" and the like may be used interchangeably to refer to a shell or other housing enclosing a reservoir for aerosol precursor composition, and including a heater.

As shown, in some examples, the reservoir 220 may be in fluid communication with a liquid transport element 222 adapted to wick or otherwise transport an aerosol precursor composition stored in the reservoir housing to a heater 224 (sometimes referred to as a heating element). In some example, a valve may be positioned between the reservoir and heater, and configured to control an amount of aerosol precursor composition passed or delivered from the reservoir to the heater.

Various examples of materials configured to produce heat when electrical current is applied therethrough may be employed to form the heater 224. The heater in these examples may be a resistive heating element such as a wire coil, micro heater or the like. Example materials from which the wire coil may be formed include Kanthal (FeCrAl), Nichrome, Molybdenum disilicide ($MoSi_2$), molybdenum silicide (MoSi), Molybdenum disilicide doped with Aluminum ($Mo(Si,Al)_2$), graphite and graphite-based materials (e.g., carbon-based foams and yarns) and ceramics (e.g., positive or negative temperature coefficient ceramics). Example implementations of heaters or heating members useful in aerosol delivery devices according to the present disclosure are further described below, and can be incorporated into devices such as illustrated in FIG. 2 as described herein.

An opening 226 may be present in the cartridge shell 218 (e.g., at the mouthend) to allow for egress of formed aerosol from the cartridge 104.

The cartridge 104 also may include one or more electronic components, which may include an integrated circuit, a memory component, a sensor, or the like. As explained in greater detail below, for example, the cartridge may include one or more Hall effect current sensors 228 configured to measure current in the cartridge. The electronic components may be adapted to communicate with the control component 208 and/or with an external device by wired or wireless means. The electronic components may be positioned anywhere within the cartridge or a base 230 thereof.

Although electronic components such as the control component 208, flow sensor 210 and Hall effect current sensor 214 are illustrated separately, it is understood that various electronic components may be combined on an electronic circuit board. Further, the electronic circuit board may be positioned horizontally relative the illustration of FIG. 1 in that the electronic circuit board can be lengthwise parallel to the central axis of the control body. In some examples, one or more electronic components may comprise their own respective circuit boards or other base elements to which they can be attached. In some examples, a flexible circuit board may be utilized. A flexible circuit board may be configured into a variety of shapes, include substantially tubular shapes. In some examples, a flexible circuit board may be combined with, layered onto, or form part or all of a heater substrate.

The control body 102 and the cartridge 104 may include components adapted to facilitate a fluid engagement therebetween. As illustrated in FIG. 2, the control body can include a coupler 232 having a cavity 234 therein. The base 230 of the cartridge can be adapted to engage the coupler and can include a projection 236 adapted to fit within the cavity. Such engagement can facilitate a stable connection between the control body and the cartridge as well as establish an electrical connection between the power source 212 and control component 208 in the control body and the heater 224 in the cartridge. Further, the control body shell 206 can include an air intake 238, which may be a notch in the shell where it connects to the coupler that allows for passage of ambient air around the coupler and into the shell where it then passes through the cavity 234 of the coupler and into the cartridge through the projection 236.

A coupler and a base useful according to the present disclosure are described in U.S. Pat. App. Pub. No. 2014/0261495 to Novak et al., which is incorporated herein by reference in its entirety. For example, the coupler 232 as seen in FIG. 2 may define an outer periphery 240 configured to mate with an inner periphery 242 of the base 230. In one example the inner periphery of the base may define a radius that is substantially equal to, or slightly greater than, a radius of the outer periphery of the coupler. Further, the coupler may define one or more protrusions 244 at the outer periphery configured to engage one or more recesses 246 defined at the inner periphery of the base. However, various other examples of structures, shapes and components may be employed to couple the base to the coupler. In some examples the connection between the base of the cartridge 104 and the coupler of the control body 102 may be substantially permanent, whereas in other examples the connection therebetween may be releasable such that, for example, the control body may be reused with one or more additional cartridges that may be disposable and/or refillable.

The aerosol delivery device 100 may be substantially rod-like or substantially tubular shaped or substantially cylindrically shaped in some examples. In other examples, further shapes and dimensions are encompassed—e.g., a rectangular or triangular cross-section, multifaceted shapes, or the like.

The reservoir 220 illustrated in FIG. 2 can be a container or can be a fibrous reservoir, as presently described. For example, the reservoir can comprise one or more layers of nonwoven fibers substantially formed into the shape of a tube encircling the interior of the cartridge shell 218, in this example. An aerosol precursor composition can be retained in the reservoir. Liquid components, for example, can be sorptively retained by the reservoir. The reservoir can be in fluid connection with the liquid transport element 222. The liquid transport element can transport the aerosol precursor composition stored in the reservoir via capillary action to the heater 224 that is in the form of a metal wire coil in this example. As such, the heater is in a heating arrangement with the liquid transport element. Example implementations of reservoirs and transport elements useful in aerosol delivery devices according to the present disclosure are further described below, and such reservoirs and/or transport elements can be incorporated into devices such as illustrated in FIG. 2 as described herein. In particular, specific combinations of heating members and transport elements as further described below may be incorporated into devices such as illustrated in FIG. 2 as described herein.

In use, when a user draws on the aerosol delivery device 100, airflow is detected by the flow sensor 210, and the heater 224 is activated to vaporize components of the aerosol precursor composition. Drawing upon the mouthend of the aerosol delivery device causes ambient air to enter the air intake 238 and pass through the cavity 234 in the coupler 232 and the central opening in the projection 236 of the base 230. In the cartridge 104, the drawn air combines with the formed vapor to form an aerosol. The aerosol is whisked, aspirated or otherwise drawn away from the heater and out the opening 226 in the mouthend of the aerosol delivery device.

In some examples, the aerosol delivery device 100 may include a number of additional software-controlled functions. For example, the aerosol delivery device may include a power-source protection circuit configured to detect power-source input, loads on the power-source terminals, and charging input. The power-source protection circuit may include short-circuit protection and under-voltage lock out. The aerosol delivery device may also include components for ambient temperature measurement, and its control component 208 may be configured to control at least one functional element to inhibit power-source charging—particularly of any battery—if the ambient temperature is below a certain temperature (e.g., 0° C.) or above a certain temperature (e.g., 45° C.) prior to start of charging or during charging.

Power delivery from the power source 212 may vary over the course of each puff on the device 100 according to a power control mechanism. The device may include a "long puff" safety timer such that in the event that a user or component failure (e.g., flow sensor 210) causes the device to attempt to puff continuously, the control component 208 may control at least one functional element to terminate the puff automatically after some period of time (e.g., four seconds). Further, the time between puffs on the device may be restricted to less than a period of time (e.g., 100 seconds). A watchdog safety timer may automatically reset the aerosol delivery device if its control component or software running on it becomes unstable and does not service the timer within an appropriate time interval (e.g., eight seconds). Further safety protection may be provided in the event of a defective or otherwise failed flow sensor 210, such as by permanently disabling the aerosol delivery device in order to prevent inadvertent heating. A puffing limit switch may deactivate the device in the event of a pressure sensor fail causing the device to continuously activate without stopping after the four second maximum puff time.

The aerosol delivery device 100 may include a puff tracking algorithm configured for heater lockout once a defined number of puffs has been achieved for an attached cartridge (based on the number of available puffs calculated in light of the e-liquid charge in the cartridge). The aerosol delivery device may include a sleep, standby or low-power mode function whereby power delivery may be automatically cut off after a defined period of non-use. Further safety protection may be provided in that all charge/discharge cycles of the power source 212 may be monitored by the control component 208 over its lifetime. After the power source has attained the equivalent of a predetermined number (e.g., 200) of full discharge and full recharge cycles, it may be declared depleted, and the control component may control at least one functional element to prevent further charging of the power source.

The various components of an aerosol delivery device according to the present disclosure can be chosen from components described in the art and commercially available. Examples of batteries that can be used according to the disclosure are described in U.S. Pat. App. Pub. No. 2010/0028766 to Peckerar et al., which is incorporated herein by reference in its entirety.

The aerosol delivery device 100 can incorporate the flow sensor 210 or another sensor or detector for control of supply of electric power to the heater 224 when aerosol generation is desired (e.g., upon draw during use). As such, for example, there is provided a manner or method of turning off power to the heater when the aerosol delivery device is not being drawn upon during use, and for turning on power to actuate or trigger the generation of heat by the heater during draw. Additional representative types of sensing or detection mechanisms, structure and configuration thereof, components thereof, and general methods of operation thereof, are described in U.S. Pat. No. 5,261,424 to Sprinkel, Jr., U.S. Pat. No. 5,372,148 to McCafferty et al., and PCT Pat. App. Pub. No. WO 2010/003480 to Flick, all of which are incorporated herein by reference in their entireties.

The aerosol delivery device 100 most preferably incorporates the control component 208 or another control mechanism for controlling the amount of electric power to the heater 224 during draw. Representative types of electronic components, structure and configuration thereof, features thereof, and general methods of operation thereof, are described in U.S. Pat. No. 4,735,217 to Gerth et al., U.S. Pat. No. 4,947,874 to Brooks et al., U.S. Pat. No. 5,372,148 to McCafferty et al., U.S. Pat. No. 6,040,560 to Fleischhauer et al., U.S. Pat. No. 7,040,314 to Nguyen et al., U.S. Pat. No. 8,205,622 to Pan, U.S. Pat. App. Pub. No. 2009/0230117 to Fernando et al., U.S. Pat. App. Pub. No. 2014/0060554 to Collet et al., U.S. Pat. App. Pub. No. 2014/0270727 to Ampolini et al., and U.S. patent application Ser. No. 14/209,191 to Henry et al., filed Mar. 13, 2014, all of which are incorporated herein by reference in their entireties.

Representative types of substrates, reservoirs or other components for supporting the aerosol precursor are described in U.S. Pat. No. 8,528,569 to Newton, U.S. Pat. App. Pub. No. 2014/0261487 to Chapman et al., U.S. patent application Ser. No. 14/011,992 to Davis et al., filed Aug. 28, 2013, and U.S. patent application Ser. No. 14/170,838 to Bless et al., filed Feb. 3, 2014, all of which are incorporated herein by reference in their entireties. Additionally, various wicking materials, and the configuration and operation of those wicking materials within certain types of electronic cigarettes, are set forth in U.S. Pat. App. Pub. No. 2014/0209105 to Sears et al., which is incorporated herein by reference in its entirety.

The aerosol precursor composition, also referred to as a vapor precursor composition, may comprise a variety of components including, by way of example, a polyhydric alcohol (e.g., glycerin, propylene glycol or a mixture thereof), nicotine, tobacco, tobacco extract and/or flavorants. Representative types of aerosol precursor components and formulations also are set forth and characterized in U.S. Pat. No. 7,217,320 to Robinson et al. and U.S. Pat. Pub. Nos. 2013/0008457 to Zheng et al.; 2013/0213417 to Chong et al.; 2014/0060554 to Collett et al.; 2015/0020823 to Lipowicz et al.; and 2015/0020830 to Koller, as well as WO 2014/182736 to Bowen et al, the disclosures of which are incorporated herein by reference. Other aerosol precursors that may be employed include the aerosol precursors that have been incorporated in the VUSE® product by R. J. Reynolds Vapor Company, the BLU™ product by Imperial Tobacco Group PLC, the MISTIC MENTHOL product by Mistic Ecigs, and the VYPE product by CN Creative Ltd. Also desirable are the so-called "smoke juices" for electronic cigarettes that have been available from Johnson Creek Enterprises LLC.

Additional representative types of components that yield visual cues or indicators may be employed in the aerosol delivery device 100, such as visual indicators and related components, audio indicators, haptic indicators and the like.

Examples of suitable LED components, and the configurations and uses thereof, are described in U.S. Pat. No. 5,154,192 to Sprinkel et al., U.S. Pat. No. 8,499,766 to Newton, U.S. Pat. No. 8,539,959 to Scatterday, and U.S. patent application Ser. No. 14/173,266 to Sears et al., filed Feb. 5, 2014, all of which are incorporated herein by reference in their entireties.

Yet other features, controls or components that can be incorporated into aerosol delivery devices of the present disclosure are described in U.S. Pat. No. 5,967,148 to Harris et al., U.S. Pat. No. 5,934,289 to Watkins et al., U.S. Pat. No. 5,954,979 to Counts et al., U.S. Pat. No. 6,040,560 to Fleischhauer et al., U.S. Pat. No. 8,365,742 to Hon, U.S. Pat. No. 8,402,976 to Fernando et al., U.S. Pat. App. Pub. No. 2005/0016550 to Katase, U.S. Pat. App. Pub. No. 2010/0163063 to Fernando et al., U.S. Pat. App. Pub. No. 2013/0192623 to Tucker et al., U.S. Pat. App. Pub. No. 2013/0298905 to Leven et al., U.S. Pat. App. Pub. No. 2013/0180553 to Kim et al., U.S. Pat. App. Pub. No. 2014/0000638 to Sebastian et al., U.S. Pat. App. Pub. No. 2014/0261495 to Novak et al., and U.S. Pat. App. Pub. No. 2014/0261408 to DePiano et al., all of which are incorporated herein by reference in their entireties.

The control component 208 includes a number of electronic components, and in some examples may be formed of a printed circuit board (PCB) that supports and electrically connects the electronic components. The electronic components may include a microprocessor or processor core, and a memory. In some examples, the control component may include a microcontroller with integrated processor core and memory, and which may further include one or more integrated input/output peripherals. In some examples, the control component may be coupled to a communication interface to enable wireless communication with one or more networks, computing devices or other appropriately-enabled devices. Examples of suitable communication interfaces are disclosed in U.S. patent application. Ser. No. 14/638,562, filed Mar. 4, 2015, to Marion et al., the content of which is incorporated by reference in its entirety. And examples of suitable manners according to which the aerosol delivery device may be configured to wirelessly communicate are disclosed in U.S. patent application Ser. No. 14/327,776, filed Jul. 10, 2014, to Ampolini et al., and U.S. patent application Ser. No. 14/609,032, filed Jan. 29, 2015, to Henry, Jr. et al., each of which is incorporated herein by reference in its entirety.

The control component 208 may be configured to control one or more functional elements of the aerosol delivery device 100 in different states of the device. In examples in which the aerosol delivery device has a housing formed of separable bodies, the aerosol delivery device, and more particularly the control component 102, may be in the standby mode when the control component is uncoupled with the cartridge 104. In examples of either a unitary or separable housing, the aerosol delivery device may be in the standby mode between puffs when the control component is coupled with the cartridge. Similarly, in examples of either a unitary or separable housing, when the user draws on the device and the flow sensor 210 detects airflow, the aerosol delivery device may be placed in the active mode during which the control component may direct power from the power source 212 to power the heater 224 (heating element) and thereby control the heater to activate and vaporize components of the aerosol precursor composition.

In accordance with some example implementations of the present disclosure, each of one or more Hall effect current sensors 214, 228 in the control body 102 and/or cartridge may be positioned proximate a conductor that interconnects or is connected to one or more electronic components of the aerosol delivery device 100. One example of a suitable Hall effect current sensor is the MLX91205 IMC-Hall® Current Sensor from Melexis NV of Ieper, Belgium. When current I flows through a conductor, a magnetic field B is produced around the conductor (see, e.g., FIGS. 3-7). The Hall effect current sensor may be configured to measure this magnetic field and output a corresponding voltage. This corresponding voltage may be proportional to the current, and the Hall effect current sensor may thereby be configured to measure the current through the conductor. The control component 208, then, may be configured to control operation of at least one functional element of the aerosol delivery device in response to the current so measured.

FIGS. 3-7 more particularly illustrate various interconnected electronic components of the control body 102 and cartridge 104, according to various example implementations. As shown, the control body may include (first) positive and negative terminals 302, 304 connectable with the power source 212. The control body may likewise include (second) positive and negative terminals 306, 308 connectable with corresponding positive and negative terminals 310, 312 of the cartridge, and these corresponding positive and negative terminals are connected to the heater 224 (heating element). The control component 208 may include a microprocessor 314 and a number of other electrical components, such as resistors, capacitors, switches and the like, which may be coupled together and with the power source and heater via conductors such as wires, traces or the like to form an electrical circuit. In some examples, the heater may include a communication terminal for communicating data such as the puff count.

Figure 3:
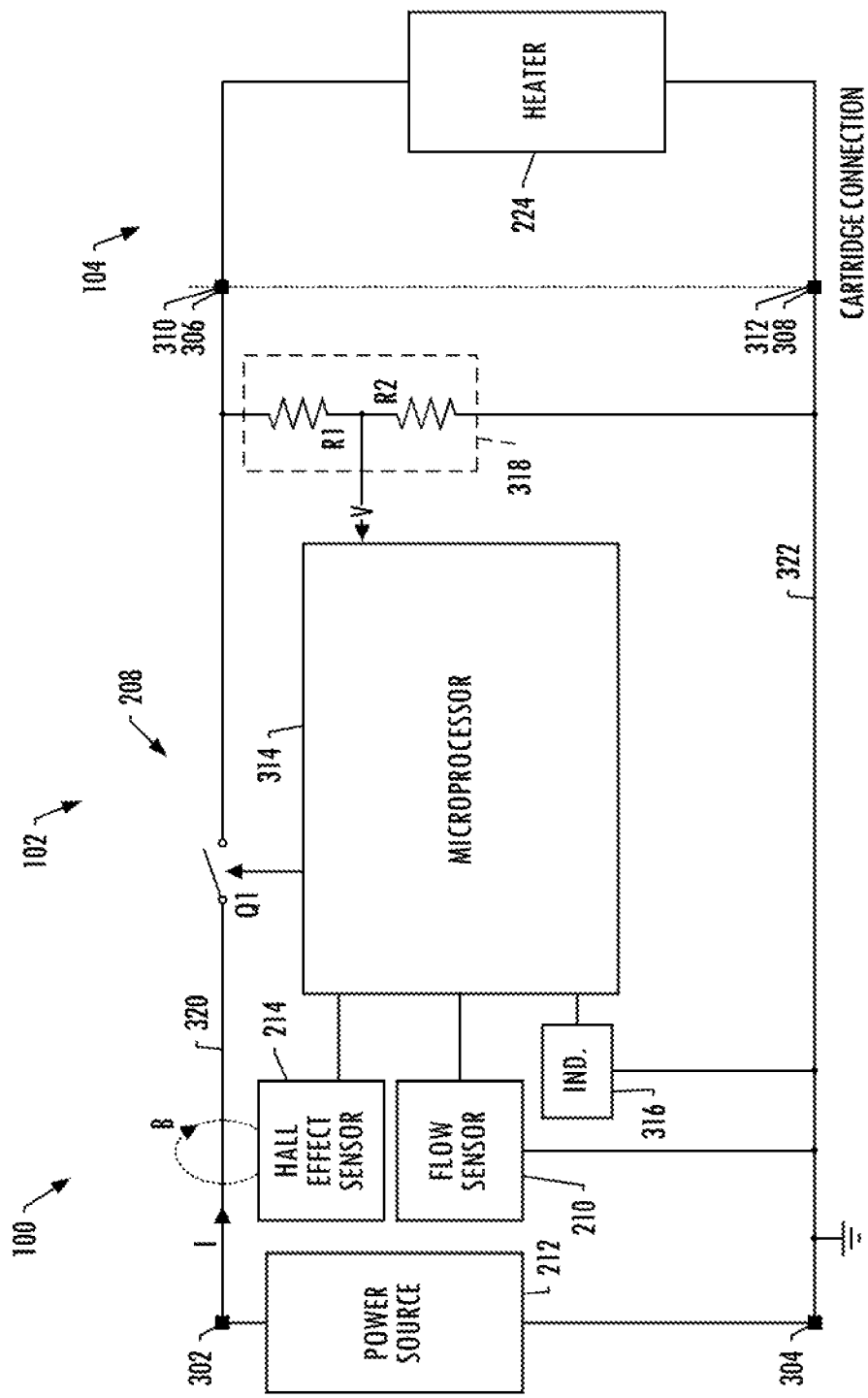
FIGS. 3-7 illustrate various elements of a control body and cartridge of the aerosol delivery device, according to various example implementations.

In accordance with example implementations of the present disclosure, the microprocessor 314 may be configured to perform a number of control operations. In the active mode, for example, the microprocessor may be configured to direct power from the power source 212 (e.g., directly or through the flow sensor 210) to turn the heater 224 on and thereby control the heater to activate the and vaporize components of the aerosol precursor composition. This may include, for example, a switch Q1 between the power source and the heater, which the microprocessor may operate in a closed state, as shown in FIG. 3. In some examples, the microprocessor may also control operation of at least one other functional element. One example of a suitable functional element may be an indicator 316 such as a visual, audio or haptic indicator.

In some examples, power delivery from the power source 212 may vary according to a power control mechanism, which may include the microprocessor 314 being configured to measure the voltage at the second positive terminal 306 and control power to the heater 224 based thereon. The voltage at the second positive terminal may correspond to a positive heater voltage. The microprocessor may operate on the actual voltage, or an analog-to-digital converter (ADC) may be included to convert the actual voltage to a digital equivalent. In some examples, the control component 208 may include a voltage divider 318 with resistors R1 and R2, which may be configured to reduce the voltage to the microprocessor.

As also shown in FIGS. 3-7, the control body 102 and/or cartridge 104 may include one or more Hall effect current sensors 214, 228 positioned proximate respective conductor(s) interconnecting or connected to various ones of the electronic components. Each Hall effect current sensor may be configured to measure to a current through a conductor, and the microprocessor 314 may be configured to control operation of at least one functional element of the control body, cartridge or aerosol delivery device 100 in response to the current so measured.

As shown in FIG. 3, in some examples, the control body 102 may include a Hall effect current sensor 214 positioned proximate a conductor 320 connected to a terminal that is connected or connectable with the power source 212. In various examples, this terminal may be the first positive terminal 302, as shown. As indicated above, the Hall effect current sensor may be configured to measure the current through the conductor. The microprocessor 314, then, may be configured to control operation of at least one functional element of the aerosol delivery device in response to the current so measured. In at least some examples, the microprocessor may be configured to cut off the power supply in an instance in which the current through the conductor is above a threshold level indicative of an over-current or over-voltage condition. The power supply may be cutoff in a number of different manners, such as by operation of one or more switches (e.g., switch Q1) between the power supply and electronic components in an open state.

Figure 4:
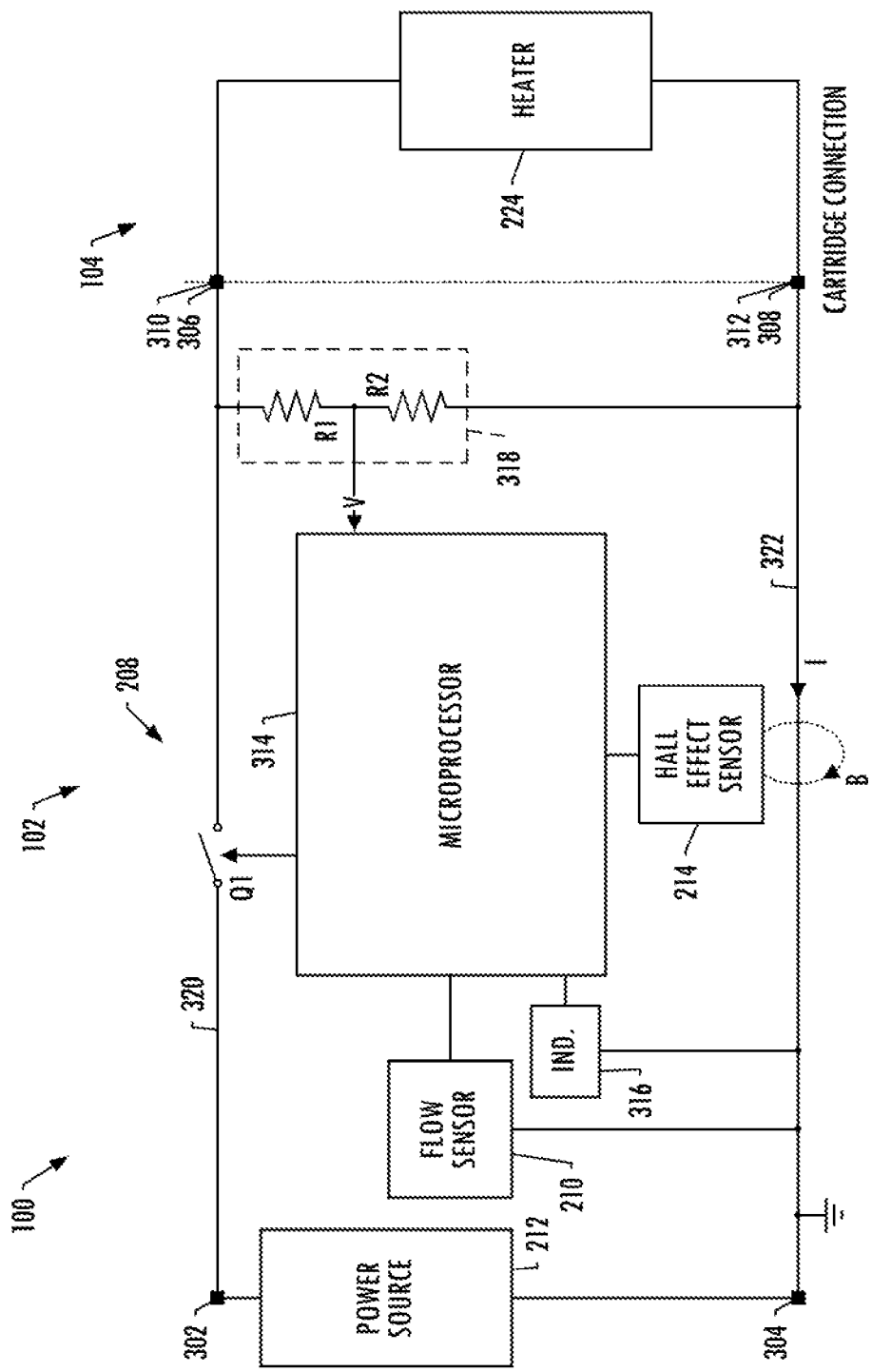

As shown in FIG. 4, in some examples, the control body 102 may include a Hall effect current sensor 214 positioned proximate a conductor 322 connected to a terminal that is connected or connectable with the heater 224. In various examples, this terminal may be the second negative terminal 308. Again, the Hall effect current sensor may be configured to measure the current through the conductor, which in these examples may correspond to a current through the heater 224 in the active mode in which the control body is coupled with the cartridge 104. The microprocessor 314, then, may be configured to control operation of at least one functional element of the aerosol delivery device in response to the current through the heater. For example, the microprocessor may be configured to control power to the heater based on the current through the heater, such as in accordance with the aforementioned power control mechanism.

In some more particular examples, the microprocessor 314 may be configured to direct power from the power source 212 (e.g., directly or through the flow sensor 210) to turn the heater 224 on and commensurately initiate a heating time period. This may include, for example, the microprocessor being configured to operate switch Q1 in the closed state. The microprocessor may then adjust the power directed to the heater based on the voltage at the second positive terminal 306, as well as the current through the heater, at a periodic rate until expiration of the heating time period.

The adjustment of power directed to the heater 224 may include the microprocessor 314 being configured to determine a moving window of measurements of instantaneous actual power directed to the heater, with each measurement of the window of measurements being determined as a product of the positive heater voltage and the current through the heater, which in FIG. 4, may be as measured by the Hall effect current sensor 214. Or in examples such as that shown in FIG. 3, the current may be measured in a number of other manners, such as from a current-sense resistor. In some examples, the microprocessor may operate on the actual current through the heater, or the control component 208 or microprocessor may include an ADC configured to convert the actual current to a digital equivalent.

The microprocessor 314 may calculate a simple moving average power directed to the heater 224 based on the moving window of measurements of instantaneous actual power, and compare the simple moving average power to a selected power set point associated with the power source 212. The microprocessor may then adjust the power directed to the heater so as to turn the heater off or on at the periodic rate at each instance in which the simple moving average power is respectively above or below the selected power set point. More information regarding aspects of a suitable power control mechanism may be found in the above-cited and incorporated U.S. Pat. App. Pub. No. 2014/0270727 to Ampolini et al.

Figure 5:
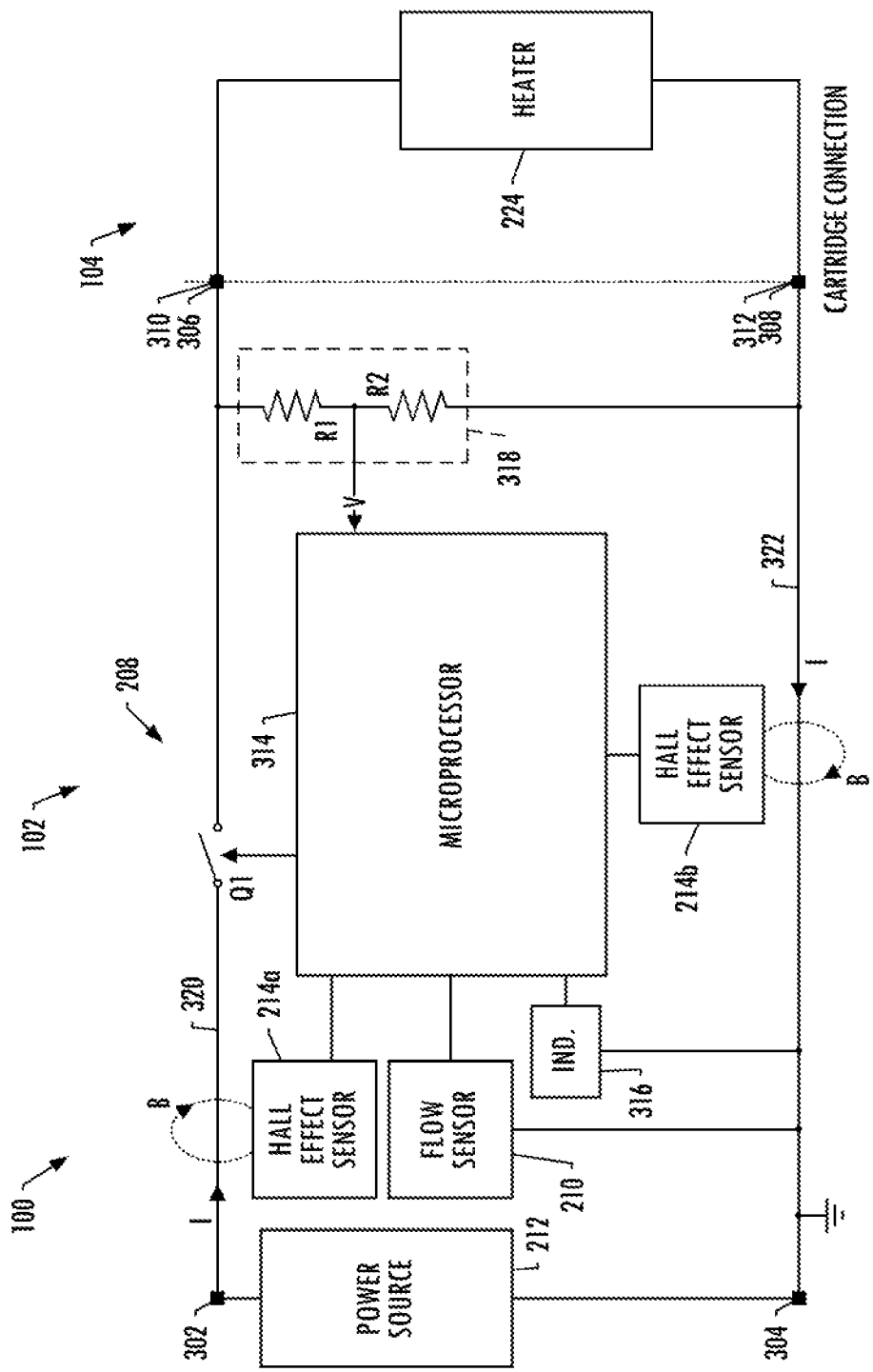

In some examples, the control body 102 may include multiple Hall effect current sensors 214. This is shown for example in FIG. 5 in which the control body includes a first Hall effect current sensor 214a corresponding to the Hall effect current sensor shown in FIG. 3, and a second Hall effect current sensor 214b corresponding to the Hall effect current sensor shown in FIG. 4. In FIG. 5, the first and second Hall effect current sensors may be positioned proximate respective conductors 320, 322 and configured to measure current through the respective conductors. The microprocessor 314 may be configured to control operation of at least one functional element of the aerosol delivery device in response to the currents so measured, such as in the same or similar manners to those described above.

Figure 6:
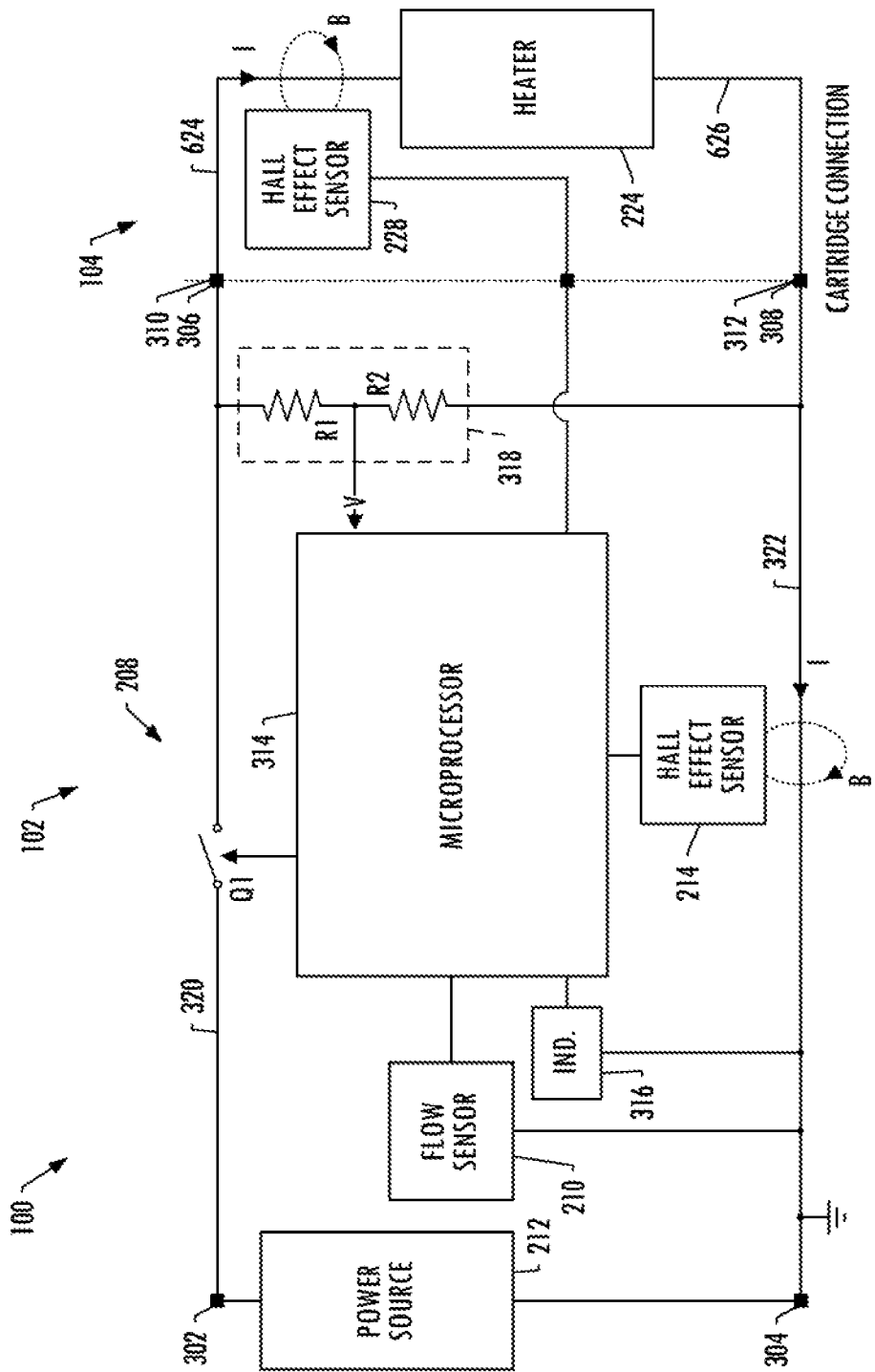
Figure 7:
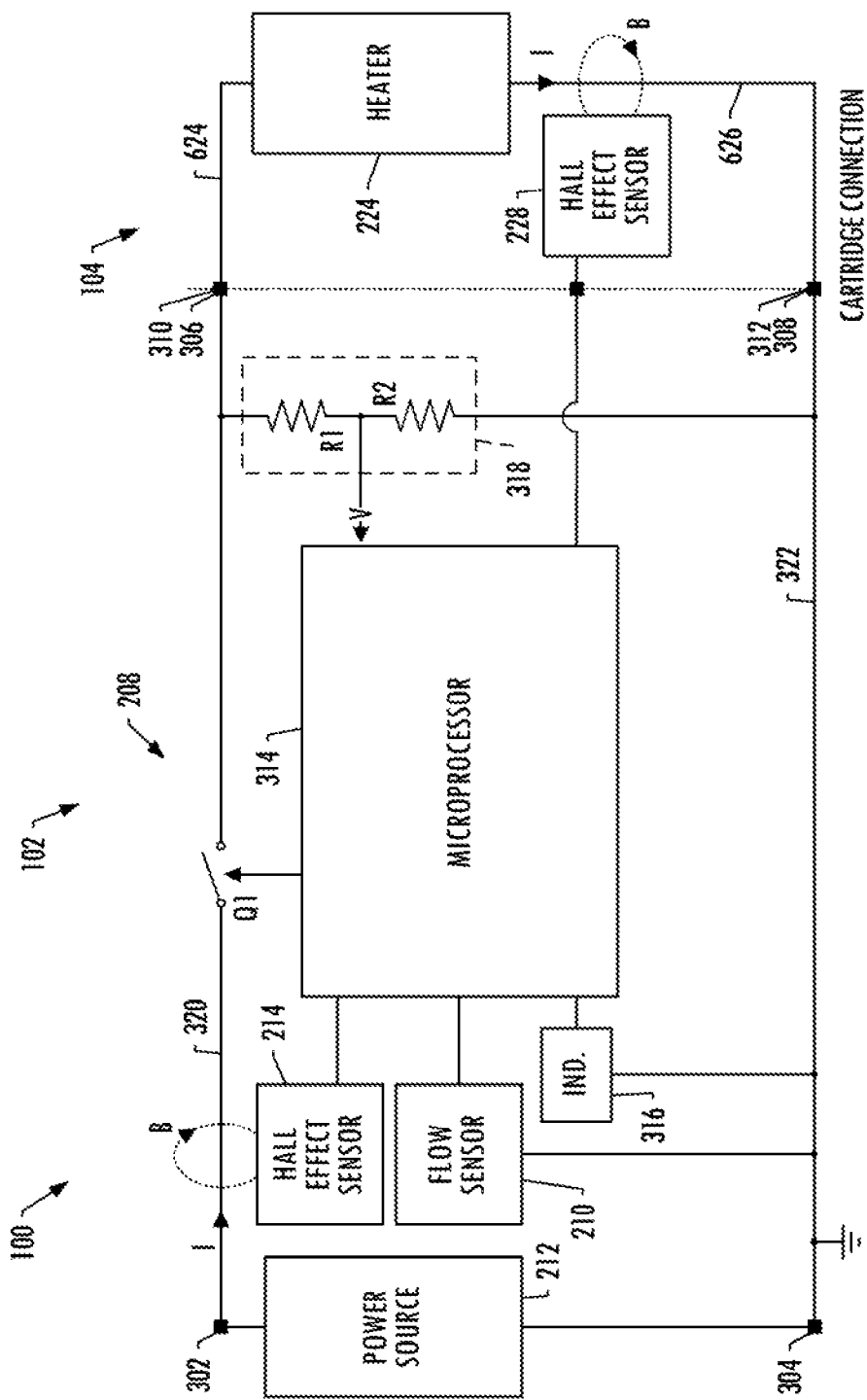

As also described above, in addition to or in lieu of the control body 102, the cartridge 104 in some examples may include one or more Hall effect current sensors 228. FIGS. 6 and 7 illustrate examples in which each of the control body and cartridge includes a Hall effect current sensor in different arrangements each of which may enable the same or similar functionality to that described above with respect to FIG. 5, and thus FIGS. 3 and 4. In other examples, the Hall effect current sensor may be omitted from the control body in FIGS. 6 and 7, or the cartridge may include the Hall effect current sensors of both FIGS. 6 and 7 (similar to the cartridge of FIG. 5 relative to FIGS. 3 and 4).

In FIG. 6, the cartridge 104 may include a Hall effect current sensor 228 positioned proximate a conductor 624 connected to a terminal that is connected or connectable with the power source 212. In various examples, this terminal may be the corresponding positive terminal 310 of the cartridge, as shown. As indicated above, the Hall effect current sensor may be configured to measure the current through the conductor. The microprocessor 314, then, may be configured to control operation of at least one functional element of the aerosol delivery device in response to the current so measured, such as in a manner similar to that described above with respect to FIG. 3. For example, the microprocessor may be configured to cut off the power supply in an instance in which the current through the conductor is above a threshold level indicative of an over-current or over-voltage condition, such as by operation of one or more switches (e.g., switch Q1) between the power supply and electronic components in an open state.

In FIG. 7, the cartridge 104 may include a Hall effect current sensor 228 positioned proximate a conductor 626 connected to a terminal that is connected or connectable with the heater 224. In various examples, this terminal may be the corresponding negative terminal 312. The Hall effect current sensor may be configured to measure the current through the conductor, which in these examples may correspond to the current through the heater 224 in the active mode. The microprocessor 314, then, may be configured to control operation of at least one functional element of the aerosol delivery device in response to the current through the heater, such as in a manner similar to that described above with respect to FIG. 4. For example, the microprocessor may be configured to control power to the heater based on the current through the heater, such as in accordance with the above-described power control mechanism.

The foregoing description of use of the article(s) can be applied to the various example implementations described herein through minor modifications, which can be apparent to the person of skill in the art in light of the further disclosure provided herein. The above description of use, however, is not intended to limit the use of the article but is provided to comply with all necessary requirements of disclosure of the present disclosure. Any of the elements shown in the article(s) illustrated in FIGS. 1-7 or as otherwise described above may be included in an aerosol delivery device according to the present disclosure.

Many modifications and other implementations of the disclosure set forth herein will come to mind to one skilled in the art to which this disclosure pertains having the benefit of the teachings presented in the foregoing descriptions and the associated drawings. Therefore, it is to be understood that the disclosure is not to be limited to the specific implementations disclosed, and that modifications and other implementations are intended to be included within the scope of the appended claims. Moreover, although the foregoing descriptions and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An aerosol delivery device comprising:
   a housing defining a reservoir configured to retain aerosol precursor composition; and
   a plurality of electronic components interconnected by or connected to one or more conductors, the plurality of electronic components including:
   a heating element;
   a control component including a processor core configured to operate in an active mode in which the control component is configured to control the heating element to activate and vaporize components of the aerosol precursor composition; and
   a Hall effect current sensor positioned proximate one of the one or more conductors, and configured to measure a current through the one of the one or more conductors, the control component being configured to control operation of the heating element or a power source therefor in response to the current measured,
   wherein the one of the one or more conductors is connected to a terminal that is connected or connectable with the power source, the control component in the active mode being configured to direct power from the power source to the heating element to activate and vaporize components of the aerosol precursor composition, and
   wherein the control component being configured to control operation of the heating element or the power source includes being configured to cut off the power source in an instance in which the current measured by the Hall effect sensor is above a threshold level indicative of an over-current or over-voltage condition.

2. The aerosol delivery device of claim 1 further comprising a second Hall effect current sensor positioned proximate a second conductor of the one or more conductors, the second conductor being connected to the heating element or connected a terminal that is connected or connectable with the heating element, and
   wherein the second Hall effect current sensor is configured to measure to a current through the second conductor that corresponds to a current through the heating element in the active mode, the control component being configured to further control operation of the heating element or the power source in response to the current measured by the second Hall effect current sensor.

3. The aerosol delivery device of claim 2, wherein the control component being configured to control operation of the heating element or the power source in response to the current measured by the second Hall effect current sensor includes in the active mode being configured to at least:
   direct power to the heating element to turn the heating element on and thereby control the heating element to activate and vaporize components of the aerosol precursor composition, and commensurately initiate a heating time period; and at a periodic rate until expiration of the heating time period,
   determine a moving window of measurements of instantaneous actual power directed to the heating element, each measurement of the window of measurements being determined as a product of a voltage at the heating element and the current through the heating element;
   calculate a simple moving average power directed to the heating element based on the moving window of measurements of instantaneous actual power; and
   adjust the power directed to the heating element to turn the heating element off or on at the periodic rate at each instance in which the simple moving average power is respectively above or below a selected power set point.

4. A control body coupled or coupleable with a cartridge that is equipped with a heating element and contains an aerosol precursor composition, the control body being coupled or coupleable with the cartridge to form an aerosol delivery device in which the heating element is configured to activate and vaporize components of the aerosol precursor composition, the control body comprising:
   a plurality of electronic components interconnected by or connected to one or more conductors, the plurality of electronic components including:
   a control component including a processor core configured to operate in an active mode in which the control body is coupled with the cartridge, the control component in the active mode being configured to control the heating element to activate and vaporize components of the aerosol precursor composition; and
   a Hall effect current sensor positioned proximate one of the one or more conductors, and configured to measure a current through the one of the one or more conductors, the control component being configured to control operation of the heating element or a power source therefor in response to the current measured,
   wherein the one of the one or more conductors is connected to a terminal that is connected or connectable with the power source, the control component in the active mode being configured to direct power from the power source to the heating element to activate and vaporize components of the aerosol precursor composition, and wherein the control component being configured to control operation of the heating element or the power source includes being configured to cut off the power source in an instance in which the current measured by the Hall effect sensor is above a threshold level indicative of an over-current or over-voltage condition.

5. The control body of claim 4 further comprising a second Hall effect current sensor positioned proximate a second conductor of the one or more conductors, the second conductor being connected to a terminal that is connected or connectable with the heating element, and wherein the second Hall effect current sensor is configured to measure to a current through the second conductor that corresponds to a current through the heating element in the active mode in which the control body is coupled with the cartridge, the control component being configured to further control operation of the heating element or the power source in response to the current measured by the second Hall effect current sensor.

6. The control body of claim 5, wherein the control component being configured to control operation of the heating element or the power source in response to the current measured by the second Hall effect current sensor includes in the active mode being configured to at least:

direct power to the heating element to turn the heating element on and thereby control the heating element to activate and vaporize components of the aerosol precursor composition, and commensurately initiate a heating time period; and at a periodic rate until expiration of the heating time period, determine a moving window of measurements of instantaneous actual power directed to the heating element, each measurement of the window of measurements being determined as a product of a voltage at the heating element and the current through the heating element;

calculate a simple moving average power directed to the heating element based on the moving window of measurements of instantaneous actual power; and adjust the power directed to the heating element to turn the heating element off or on at the periodic rate at each instance in which the simple moving average power is respectively above or below a selected power set point.

7. A cartridge coupled or coupleable with a control body that is equipped with a control component including a processor core, the control body being coupled or coupleable with the cartridge to form an aerosol delivery device, the cartridge comprising:

a housing defining a reservoir configured to retain aerosol precursor composition; and a plurality of electronic components interconnected by or connected to one or more conductors, the plurality of electronic components including:

a heating element configured to operate in an active mode in which the cartridge is coupled with the control body, the heating element in the active mode being controllable by the control component to activate and vaporize components of the aerosol precursor composition; and a Hall effect current sensor positioned proximate one of the one or more conductors, and configured to measure a current through the one of the one or more conductors, the control component being configured to control operation of the heating element or a power source therefor in response to the current measured, wherein the one of the one or more conductors is connected to a terminal that is connected or connectable with the power source, the control component in the active mode being configured to direct power from the power source to the heating element to activate and vaporize components of the aerosol precursor composition, and wherein the control component being configured to control operation of the heating element or the power source includes being configured to cut off the power source in an instance in which the current measured by the Hall effect sensor is above a threshold level indicative of an over-current or over-voltage condition.

8. The cartridge of claim 7 further comprising a second Hall effect current sensor positioned proximate a second conductor of the one or more conductors, the second conductor being connected to the heating element, and wherein the second Hall effect current sensor is configured to measure to a current through the second conductor that corresponds to a current through the heating element in the active mode in which the control body is coupled with the cartridge, the control component being configured to further control operation of the heating element or the power source in response to the current measured by the second Hall effect current sensor.

9. The cartridge of claim 8, wherein the control component being configured to control operation of the heating element or the power source in response to the current measured by the second Hall effect current sensor includes in the active mode being configured to at least:

direct power to the heating element to turn the heating element on and thereby control the heating element to activate and vaporize components of the aerosol precursor composition, and commensurately initiate a heating time period; and at a periodic rate until expiration of the heating time period, determine a moving window of measurements of instantaneous actual power directed to the heating element, each measurement of the window of measurements being determined as a product of a voltage at the heating element and the current through the heating element;

calculate a simple moving average power directed to the heating element based on the moving window of measurements of instantaneous actual power; and adjust the power directed to the heating element to turn the heating element off or on at the periodic rate at each instance in which the simple moving average power is respectively above or below a selected power set point.

* * * * *